United States Patent [19]
Nelson

[11] Patent Number: 4,923,000
[45] Date of Patent: May 8, 1990

[54] HEAT EXCHANGER HAVING PIEZOELECTRIC FAN MEANS

[75] Inventor: Richard D. Nelson, Austin, Tex.

[73] Assignee: Microelectronics and Computer Technology Corporation, Austin, Tex.

[21] Appl. No.: 318,297

[22] Filed: Mar. 3, 1989

[51] Int. Cl.$^5$ .................... H01L 23/46; F04B 35/04
[52] U.S. Cl. .................... 165/122; 165/185; 417/322; 417/436; 361/384
[58] Field of Search .............. 165/104.33, 120, 121, 165/122, 185; 417/322, 436; 361/384, 385

[56] References Cited

U.S. PATENT DOCUMENTS

| | | | |
|---|---|---|---|
| 4,498,851 | 2/1985 | Kolm et al. | 417/436 |
| 4,520,425 | 5/1985 | Ito | 361/384 |
| 4,780,062 | 10/1988 | Yamada | 417/436 |

FOREIGN PATENT DOCUMENTS 2870  1/1979  Japan .................... 417/322

OTHER PUBLICATIONS

Brochure, "Miniature DC Powered Piezo Fans" by Piezo Electric Products.
M. Toda, "Theory of Air Flow Generation by a Resonant Type PVF2 Bimorph Cantilever Vibrator, Ferroelectronics", vol. 22, pp. 911-918 (1979).

Primary Examiner—Albert W. Davis, Jr.
Attorney, Agent, or Firm—Fulbright & Jaworski

[57] ABSTRACT

A fluid heat exchanger for cooling an electronic component including a housing having a fluid inlet and fluid outlet. Piezoelectric means are connected to a plurality of flexible blades for pumping fluid from the inlet to the outlet. A heat conductive structure is connected to the housing base for conducting heat to the fluid. The heat conductive structure may include the flexible blades and/or fixed metal fins.

7 Claims, 1 Drawing Sheet

HEAT EXCHANGER HAVING PIEZOELECTRIC FAN MEANS

BACKGROUND OF THE INVENTION

Piezoelectric fans for blowing air over an electronic circuit board have been used for cooling. The present invention is directed to providing a high efficiency finned heat exchanger in which at least some of the fins include piezoelectric drive means for pumping cooling fluid through the heat exchanger. Such a structure provides several advantages. First, such a heat exchanger does not require a separate fan or pump for the cooling fluid. Secondly, the heat transfer from the electronic component to be cooled is greatly increased by the use of a heat exchanger having heat conducting means for conducting heat from the electronic component to the cooling fluid. Thirdly, the heat conducting means may include a plurality of flexible blades which are vibrated by piezoelectric drive means and/or fixed metal fins positioned adjacent the flexible blades.

SUMMARY

The present invention is directed to a fluid heat exchanger for cooling an electronic component and includes a housing having a base for receiving heat from an electronic component. The housing also includes a fluid inlet and a fluid outlet. A plurality of flexible blades are positioned in the housing and piezoelectric means are connected to the blades for vibrating the blades to flow fluid from the inlet to the outlet. Means are provided in the housing connected to the base for conducting heat from the base to the flowing fluid.

Still a further object of the present invention is wherein the means for conducting heat from the base to the cooling fluid are flexible blades which include a heat conductive material.

Still a further object of the present invention is wherein the means for conducting heat from the base to the fluid includes fixed metal fins positioned adjacent the flexible blades and generally parallel to the blades.

Other and further objects, features and advantages will be apparent from the following description of a presently preferred embodiment of the invention, given for the purpose of disclosure, and taken in conjunction with the accompanying drawing.

DESCRIPTION OF THE PREFERRED EMBODIMENT

Figure 1:
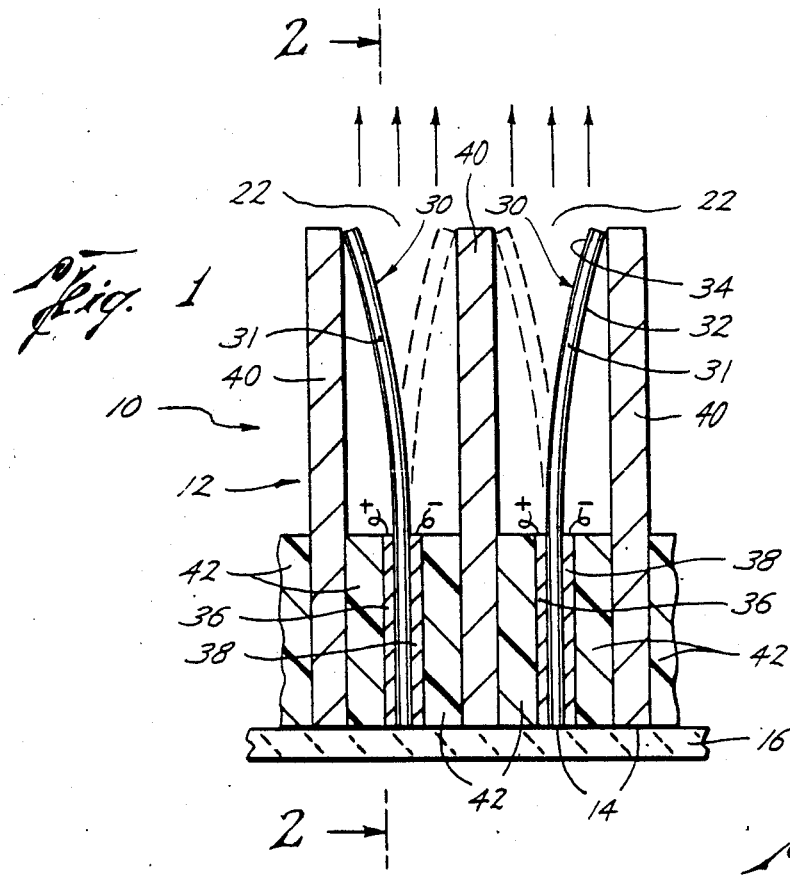
FIG. 1 is a fragmentary elevational view, in cross section, of the present invention.
Figure 2:
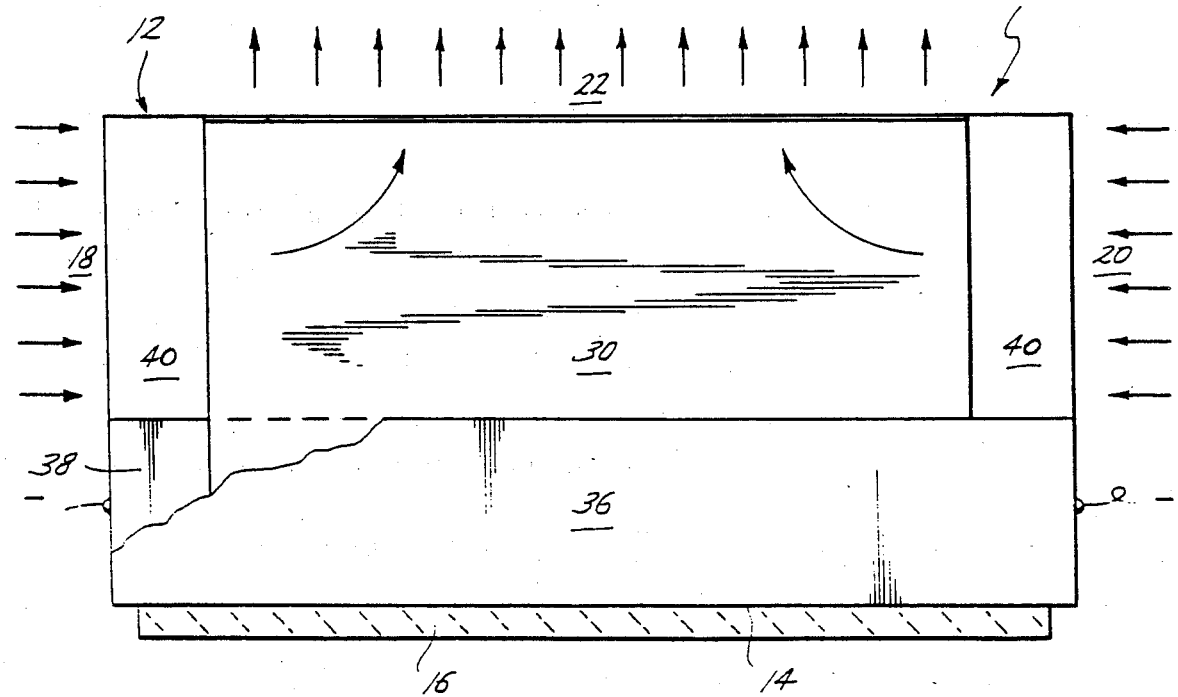
FIG. 2 is a cross-sectional view taken along the line 2—2 of FIG. 1.

Referring now to the drawing, and particularly to FIG. 2, the heat exchanger of the present invention is generally indicated by the reference numeral 10 and includes a housing 12 having a base 14 for receiving heat from an electronic component such as an electronic chip 16. The housing 12 may include one or more fluid inlets 18 and 20 and a fluid outlet 22. Cooling fluid, such as air or liquid, is drawn through the inlets 18 and 20 and out the outlet 22 as indicated by the arrows.

A plurality of flexible blades generally indicated by the reference numeral 30 are positioned in the housing 12 for acting as fan elements. A piezoelectric coating is connected to the sides of the blades making them piezoelectric bimorphs which are capable of deflecting and bending when a voltage is applied. As an example, the blades 30 may be comprised of conventional ferroelectric or PVDF (polyvinylidene fluoride) layers 32 and 34 connected to a brass base 31. Thus, when varying voltage means are connected to the layers 32 and 34, the blades 30 vibrate thereby acting as fans to pump or flow fluid from the inlets 18 and 20 to the outlet 22. However, any suitable piezo driven fan blades 30 could be used such as any suitable two element or three element piezoelectric fan unit. Electrical leads 36 and 38 are positioned on opposite sides 32 and 34, respectively, of the blades 30 for providing the electrical supply for driving the piezoelectric blades 30 between the position shown in solid outline and the position shown in dotted outline. Electrically insulating shims 42 are provided for insulating the electrical leads 36 and 38 from other electrical components in the heat exchanger 10.

In order to transmit the heat from the electrical component 16 to the cooling fluid, means are provided for conducting heat from the base 14 to the inside of the housing 12 for contact with the cooling fluid. Preferably, the flexible blades 30 include a heat conductive material 31 such as copper or aluminum whereby the blades 30 not only circulate the cooling fluid but act to remove the heat from the chip 16. The blades 30 may be driven at any suitable speed such as a frequency from 20 to 1000 hertz and it may be possible to increase fluid flow by operating at either the first or second resonant frequencies of the flexible blades 30. It may be advantageous to place piezoelectric material on only part of the flexible base 31 to allow the blades 30 to conduct as much heat as possible.

As an alternative to the heat conducting flexible blades 30, and preferably as an additional structure for conducting heat from the base 14, a plurality of fixed heat conductive fins 40 are provided. The fins 40 may be of any suitable conductive material such as copper and are preferably positioned generally parallel to the flexible blades 30 and on each side of each flexible blade 30. Thus the fixed fins 40 conduct heat from the electronic chip 16 and are subjected to the moving cooling fluid flow caused by the action of the flexible blades 30 to increase the efficiency of cooling of the heat exchanger 10. Therefore, the present invention provides a heat exchanger with a plurality of fins and flexible blades used as an integral fan and cooling heat exchanger for cooling electronic chips.

The present invention, therefore, is well adapted to carry out the objects and attain the ends and advantages mentioned as well as others inherent therein. While a presently preferred embodiment of the invention has been given for the purpose of disclosure, numerous changes in the details of construction and arrangement of parts will be readily apparent to those skilled in the art and which are encompassed within the spirit of the invention and the scope of the appended claims.

What is claimed is:

1. A fluid heat exchanger for cooling an electronic component comprising,
   a housing having a base for receiving heat from an electronic component,
   said housing having a fluid inlet and a fluid outlet,
   a plurality of flexible blades positioned in the housing,
   piezoelectric means connected to the blades for vibrating the blades to flow fluid from the inlet to the outlet, means in the housing connected to the base for conducting heat from the base to the flow of fluid, and said means for conducting heat from its base are the flexible blades which are of a heat conductive material.

2. The apparatus of claim 1 wherein the piezoelectric means partially cover the blades.

3. The apparatus of claim 1 wherein the means for conducting heat from the base includes fixed metal fins positioned adjacent the flexible blades.

4. The apparatus of claim 3 wherein the fixed metal fins are generally parallel to the flexible blades.

5. The apparatus of claim 4 wherein a fixed metal fin is positioned on each side of each flexible blade.

6. A fluid heat exchanger for cooling an electronic component comprising, a housing having a base for receiving heat from an electronic component, said housing having a fluid inlet and a fluid outlet, a plurality of flexible blades positioned in the housing, piezoelectric means connected to the blades for vibrating the blades to flow fluid from the inlet to the outlet, means in the housing connected to the base for conducting heat from the base to the flow of fluid including fixed metal fins positioned adjacent the flexible blades, said fixed metal fins being positioned generally parallel to the flexible blades, and wherein a fixed metal fin is positioned on each side of each flexible blade.

7. A fluid heat exchanger for cooling an electronic component comprising, a housing having a base for receiving heat from an electronic component, said housing having a fluid inlet and a fluid outlet, a plurality of flexible blades positioned in the housing, piezoelectric means connected to the blades for vibrating the blades to flow fluid from the inlet to the outlet, means in the housing connected to the base for conducting heat from the base to the flow of fluid, and said means for conducting heat from its base are the flexible blades which include a heat conductive material.

* * * * *